US007312556B2

(12) United States Patent
Tahara et al.

(10) Patent No.: US 7,312,556 B2
(45) Date of Patent: Dec. 25, 2007

(54) ULTRASONIC PROBE AND MANUFACTURING PROCESS THEREOF

(75) Inventors: Yoshihiro Tahara, Saitama (JP); Isamu Shimura, Saitama (JP); Takashi Kondoh, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 365 days.

(21) Appl. No.: 11/111,170

(22) Filed: Apr. 21, 2005

(65) Prior Publication Data

US 2005/0242689 A1 Nov. 3, 2005

(30) Foreign Application Priority Data

Apr. 28, 2004 (JP) ............................ 2004-132495

(51) Int. Cl.
*H01L 41/04* (2006.01)
*B06B 1/06* (2006.01)

(52) U.S. Cl. ....................... 310/334; 310/326; 600/459

(58) Field of Classification Search ................ 310/334, 310/326; 600/439, 453, 459, 462
See application file for complete search history.

(56) References Cited

U.S. PATENT DOCUMENTS 3,854,060 A * 12/1974 Cook ......................... 310/326
4,217,684 A * 8/1980 Brisken et al. ............ 29/25.35
4,556,814 A * 12/1985 Ito et al. ...................... 310/334
5,142,187 A * 8/1992 Saito et al. ................. 310/358
5,327,895 A * 7/1994 Hashimoto et al. ......... 600/459
5,920,523 A * 7/1999 Hanafy et al. .............. 367/140
6,020,675 A * 2/2000 Yamashita et al. .......... 310/358
6,044,533 A * 4/2000 Bureau et al. ............. 29/25.35
6,140,749 A * 10/2000 Nakatani .................... 310/366
6,268,683 B1 * 7/2001 Li .............................. 310/348
6,278,224 B1 * 8/2001 Sawada et al. ............. 310/334
6,341,408 B2 * 1/2002 Bureau et al. ............. 29/25.35
6,538,363 B2 * 3/2003 Nagahara et al. ........... 310/334
6,758,094 B2 * 7/2004 Miller ......................... 73/632
6,803,701 B2 * 10/2004 Kikuchi et al. ............. 310/334
6,859,984 B2 * 3/2005 Dinet et al. ................ 29/25.35
7,053,530 B2 * 5/2006 Baumgartner et al. ...... 310/334
7,143,487 B2 * 12/2006 Kikuchi et al. ............ 29/25.35

(Continued)

FOREIGN PATENT DOCUMENTS

JP HEI 10-282074 10/1998

*Primary Examiner*—J. San Martin
(74) *Attorney, Agent, or Firm*—Scott D. Wofsy; Edwards Angell Palmer & Dodge LLP

(57) ABSTRACT

The invention relates to an ultrasonic probe in which the array accuracy of lead wires, and heat resistance when connecting to a connector are enhanced, and a manufacturing method therefor. The ultrasonic probe of the invention is one in which a plurality of piezoelectric elements are arrayed in a two-dimensional direction on a fixing base, and lead wires from the lower surface of each of the piezoelectric elements are inserted through the fixing base, and the electrically connected lead wires are led out, and the fixing base has an opening portion in an array direction of the piezoelectric elements, and comprises unit fixing plates laminated in the array direction, and grooves through which the lead wires are inserted, are formed on one principal surface of the unit fixing plates, and damper material is filled into the opening portion. The invention is also for a manufacturing method for the ultrasonic probe.

3 Claims, 5 Drawing Sheets

U.S. PATENT DOCUMENTS

| | | | | |
|---|---|---|---|---|
| 7,161,281 | B2 * | 1/2007 | Takeuchi et al. | 310/334 |
| 2004/0070315 | A1 * | 4/2004 | Takeuchi et al. | 310/334 |
| 2007/0046149 | A1 * | 3/2007 | Zipparo et al. | 310/334 |
| 2007/0085452 | A1 * | 4/2007 | Coleman | 310/334 |

* cited by examiner

ULTRASONIC PROBE AND MANUFACTURING PROCESS THEREOF

BACKGROUND OF THE INVENTION

The present invention relates to an ultrasonic probe in which piezoelectric elements are arrayed in a two dimensional form, and in particular to an ultrasonic probe in which lead wires are led out with a high degree of accuracy, and to a manufacturing method therefor.

Ultrasonic probes are widely used, for example, as the ultrasonic transmitting and receiving section in medical diagnostic equipment. As such equipment, there are those which have piezoelectric elements arrayed in a two-dimensional form and which scan electronically in a two-dimensional direction for high resolution.

FIG. 6 is a perspective view for explaining a conventional ultrasonic probe.

This ultrasonic probe comprises a plurality of piezoelectric elements 1*a*, 1*b* and 1*c* arrayed on the upper surface of a fixing base 2 in a two-dimensional direction (lengthwise direction (X) and widthwise direction (Y)). Each of the piezoelectric elements 1*a*, 1*b* and 1*c* has driving electrodes 3*a* and 3*b* on both of their principal surfaces (upper surface and lower surface). The fixing base 2 normally comprises a damper material such as rubber that has a vibration damping function for inhibiting vibration, to prevent reflection of ultrasonic waves. Generally, the damper material is called a backing material. Moreover, a lead wire 4 is connected to the driving electrode 3*b* provided on the lower surface of the piezoelectric element 1, and passes through the fixing base 2 and is led out to the back side thereof. Here, the lead wire 4 is exposed on the back side of the fixing base 2, and is connected to a power supply cable by a connector (not shown).

In order to manufacture such a conventional ultrasonic probe, first of all, for example as shown in FIG. 7, a plurality of comb shaped integrated lead wires 4A in which the lead wires 4 are formed from a thin plate and are connected by a connection portion 5, are arrayed in parallel, inside a mold box (not shown). Then, a damper material of synthetic resin that constitutes the fixing base 2, is poured into the mold box, and allowed to harden to integrate the integrated lead wires 4A. Next, both principal surfaces (upper surface and lower surface) of the damper material are ground to expose the connection portion 5 and a rear end portion of the integrated lead wire 4A [Refer to Japanese Unexamined Patent Publication(TOKKYO KOKAI)No. Hei 10-282074 (Japanese Patent No. 3507655)].

Finally, a piezoelectric plate 6 is fixed to the one principal surface of the fixing base 2 which had the connection portion 5 exposed, and the areas between the respective lead wires 4 and between the integrated lead wires 4A are cut away to divide up the fixing base 2 into individual piezoelectric elements 1*a*, 1*b* and 1*c* (see FIG. 6). As a result, the electrically connected lead wires 4 are led out from the lower surface of the individual piezoelectric elements 1.

However, in the conventional ultrasonic probe of the above construction, since a damper material is used as the fixing base 2, then for example when connecting the lead wires 4 exposed on the underside, to the connector (not shown) using solder, the connection operation becomes difficult due to a lack of heat resistance. Moreover, accurately aligning the comb shaped integrated lead wire 4A inside the mold box is difficult. Therefore, there is a problem in that array accuracy of the lead wires 4 is reduced, and so forth.

An object of the present invention is to provide an ultrasonic probe in which the array accuracy of the lead wires, and the heat resistance when connecting to a connector are enhanced, and a manufacturing method therefor.

SUMMARY OF THE INVENTION

The ultrasonic probe of the present invention is one where, in an ultrasonic probe in which a plurality of piezoelectric elements are arrayed in a two-dimensional direction on a fixing base, and lead wires from the lower surface of each of the piezoelectric elements that are electrically connected and are inserted through the fixing base are led out, the construction is such that, the fixing base has an opening portion in an array direction of the piezoelectric elements, and comprises unit fixing plates laminated in the array direction, and grooves through which the lead wires are inserted, are formed on one principal surface of the unit fixing plates, and damper material is filled into the opening portion.

Furthermore, the manufacturing method for an ultrasonic probe of the present invention, comprises, in a manufacturing method for an ultrasonic probe in which a plurality of piezoelectric elements are arrayed in a two dimensional direction on a fixing base, and lead wires from a lower surface of each of the piezoelectric elements that are electrically connected and are inserted into the fixing base are led out: a step for laminating a plurality of unit fixing plates that have an opening portion passing through a plate surface and have grooves provided in parallel in a vertical direction of the plate surface, to form a fixing base; a step for inserting lead wires into each groove in the unit fixing plates of the laminated fixing base; a step for cutting away both principal surfaces of the fixing base to expose the lead wires; a step for fixing a piezoelectric plate to an upper surface of the fixing base; and a step for cutting out between the lead wires of the fixing base to divide up the fixing base into a plurality of piezoelectric elements.

According to the ultrasonic probe of the present invention, due to the thickness of the unit fixing plate, and grooves formed therein, the array accuracy of the lead wires is enhanced. Furthermore, since damper material is filled into the opening portion formed in the fixing base, then by selecting the material for the fixing base, heat resistance when connecting to a connector can be improved. Moreover, according to the manufacturing method for an ultrasonic probe of the present invention, the ultrasonic probe of the present invention can be manufactured easily.

BEST MODE FOR CARRYING OUT THE INVENTION

A best mode for the ultrasonic probe of the present invention, is to make the fixing base from ceramic, and as a result, heat resistance when connecting to the connector is improved. Moreover, opening portions are provided beforehand in the unit fixing plates. Therefore, the opening portions can be formed easily when laminating the unit fixing plates to construct the fixing base.

Also, a best mode for the manufacturing method of the ultrasonic probe of the present invention is to mirror-polish both principal surfaces of the unit fixing plates, and laminate them by direct union. As a result, an adhesive becomes unnecessary, and the thickness of the adhesive layer can be disregarded. Therefore the degree of orientation of the lead wires can be improved.

Furthermore, in the manufacturing method for the ultrasonic probe of the present invention, the unit fixing plates are fusion laminated by glass which is filled into other grooves provided between the aforementioned grooves.

Moreover, in the manufacturing method for the ultrasonic probe of the present invention, the lead wires inserted into the grooves are made to be a comb shaped integrated lead wire. As a result, insertion of the lead wires into the grooves become easier.

DETAILED DESCRIPTION OF THE PREFERRED EMBODIMENTS

First Embodiment

Figure 1:
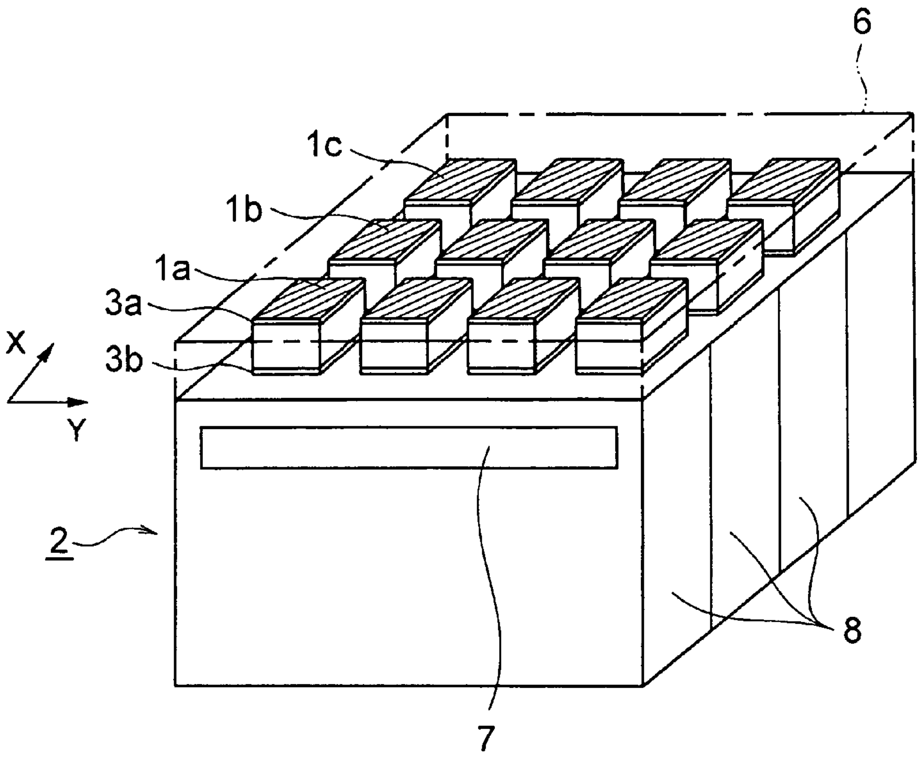
FIG. 1 is an upper surface perspective view for explaining a first embodiment of an ultrasonic probe of the present invention.
Figure 2:
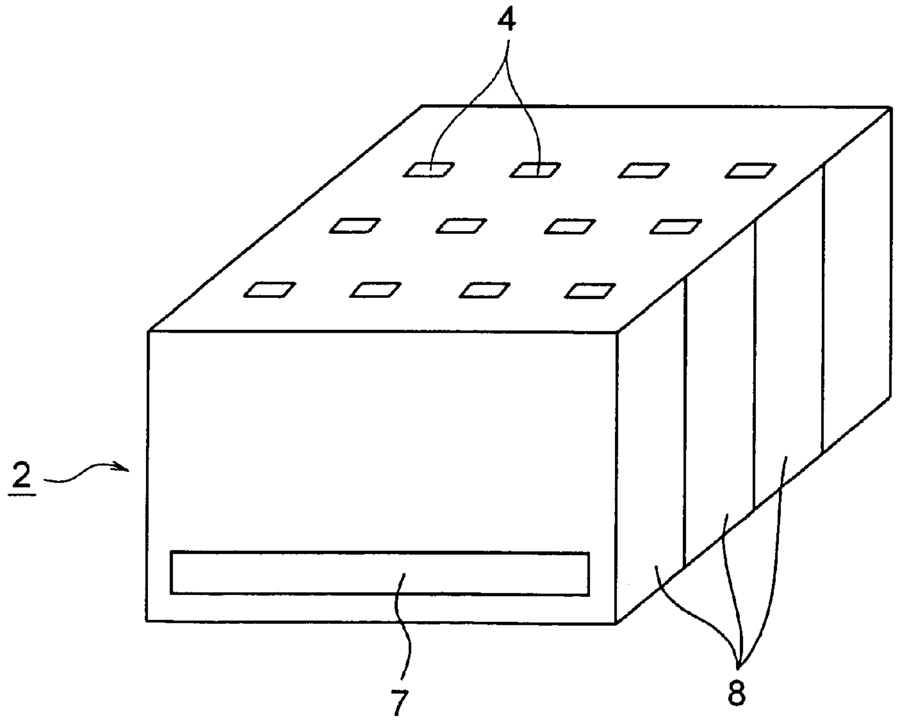
FIG. 2 is a back face perspective view of the ultrasonic probe shown in FIG. 1.
Figure 3:
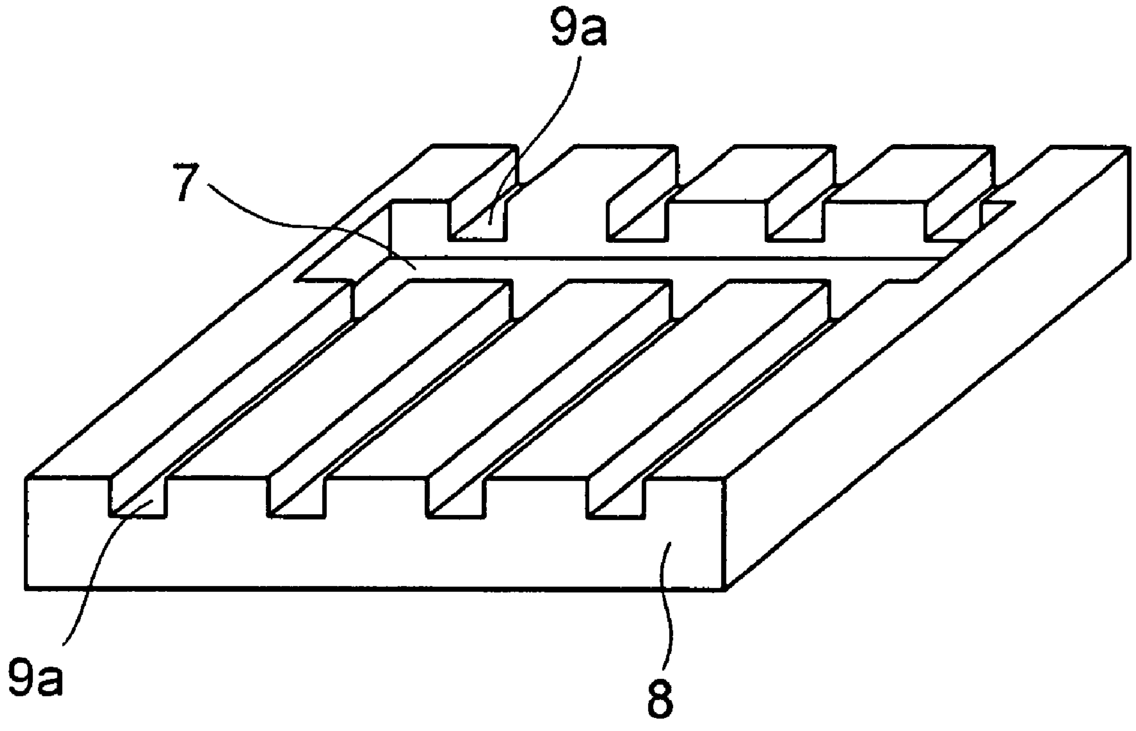
FIG. 3 is a perspective view of a unit fixing plate used in the first embodiment of the ultrasonic probe of the present invention.

FIG. 1 to FIG. 3 are diagrams for explaining a first embodiment of an ultrasonic probe of the present invention. FIG. 1 is an upper surface perspective view of the ultrasonic probe, FIG. 2 is a back face perspective view of the ultrasonic probe shown in FIG. 1, and FIG. 3 is perspective view of a unit fixing plate of the ultrasonic probe.

As shown in FIG. 1, in the ultrasonic probe of the present invention a plurality of piezoelectric elements 1*a*, 1*b* and 1*c*, which have driving electrodes 3*a* and 3*b* on their upper and lower surfaces, are arrayed on a fixing base 2 in a two dimensional direction (lengthwise (X) and widthwise (Y) direction). Lead wires 4 shown in FIG. 2 are respectively connected to the driving electrodes 3*b* provided on the lower surfaces of the piezoelectric elements 1*a*, 1*b* and 1*c*. As shown in FIG. 2, the lead wires 4 are made so as to be exposed from the lower surface of the fixing base 2.

In this first embodiment, the fixing base 2 is formed from ceramic, and has an opening portion 7 spanning in the array direction of the piezoelectric elements 1*a*, 1*b* and 1*c* (for example the lengthwise direction (X)). A damper material having a vibration damping function, is filled into this opening portion 7. Moreover, the fixing base 2 comprises a plurality of unit fixing plates 8 laminated in the array (X) direction.

As shown in FIG. 3, the respective unit fixing plates 8 have opening portions passing through their plate surfaces, and a plurality of grooves 9*a* are provided on one principal surface, extending in a vertical direction orthogonal to the array direction (lengthwise direction (X)). Furthermore, for example, both principal surfaces of the unit fixing plate 8 are mirror-polished, and each of the unit fixing plates 8 are laminated by intermolecular bonding by direct union, thus constructing the fixing base 2.

In the ultrasonic probe of the present invention constructed in this way, first a plurality of ceramic flat plates having the opening portions 7 as shown in FIG. 3 are cast by firing, and then the unit fixing plates 8 are formed by forming a plurality of grooves 9*a* in parallel in the vertical direction. Then, both principal surfaces of the unit fixing plates 8 are mirror-polished. Next, the unit fixing plates 8 are superposed and heat treated. As a result, each of the unit fixing plates 8 is laminated by direct intermolecular bonding by van der Waals force bonding. As a result, the fixing base 2 that has the opening portion 7 in the array direction (lengthwise direction (X)), and that has a plurality of first grooves 9*a* in the vertical direction is obtained.

Figure 4:
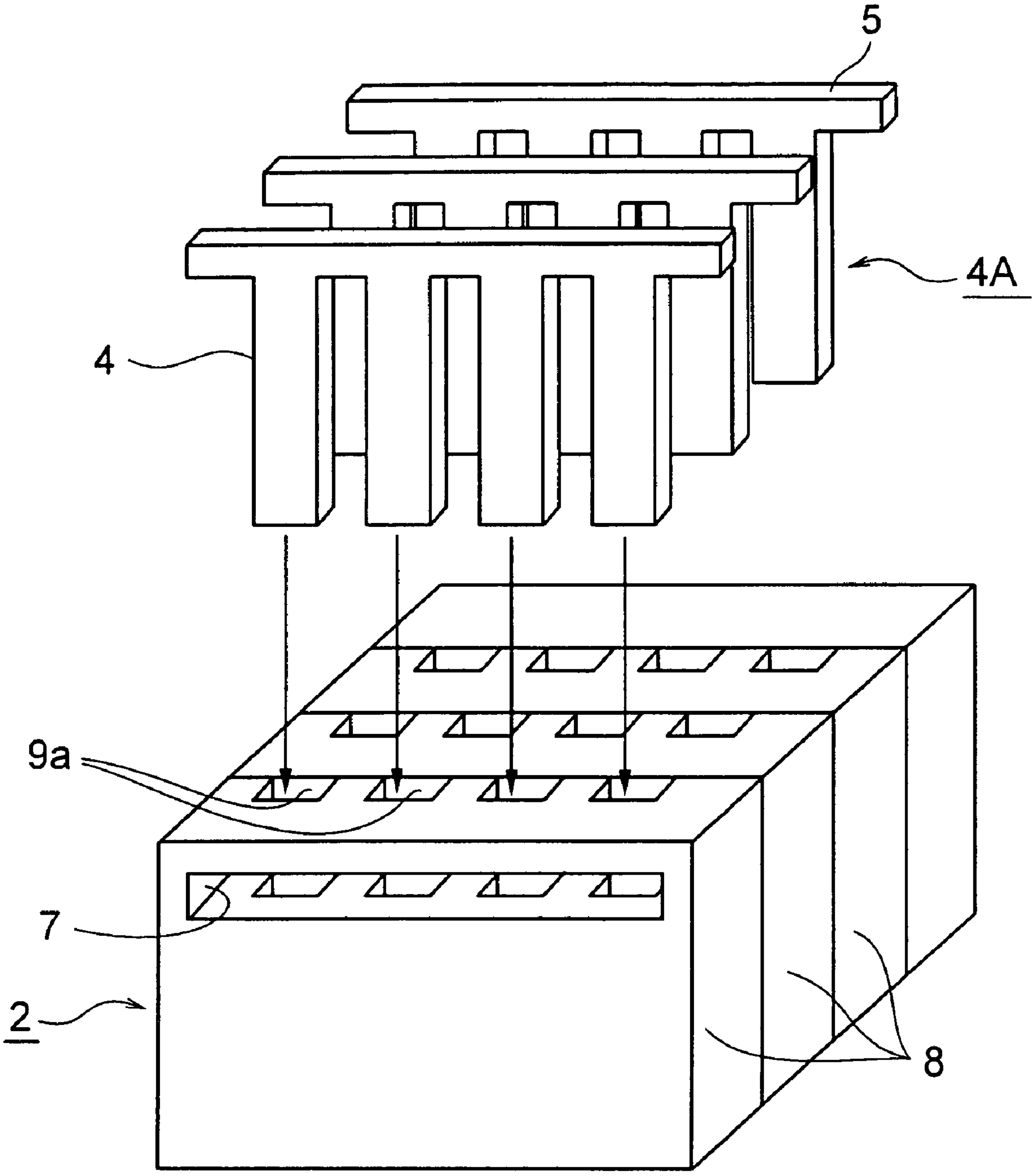
FIG. 4 is an assembly perspective view illustrating a method of insertion of integrated lead wires into a fixing base used in the first embodiment of the ultrasonic probe of the present invention.

Next, as shown in FIG. 4, the lead wires 4 are connected by a connection portion 5 and the comb shaped integrated lead wire 4A is inserted into the grooves 9*a* in the fixing base 2. Then, both principal surfaces of the fixing base 2 are partially removed to expose the lead wires 4 on both principal surfaces. Next, the damper material is poured into the opening portion 7 of the fixing base 2, and hardened. Finally, the connection portion 5 is cut away and the one principal surface of the fixing base 2 is smoothened, after which a piezoelectric plate (see the piezoelectric plate 6 shown in FIG. 1) is fixed on the one principal surface of the fixing base 2. In addition, the piezoelectric plate and the area between the lead wires 4 are cut using a dicing saw or the like, to form cut outs, first in a one-dimensional direction in the fixing base 2, and then in a two-dimensional direction, to divide up the area. By cutting between each of the lead wires 4, the fixing base 2 is made to have the respective piezoelectric elements 1*a*, 1*b* and 1*c*. Moreover, the lead wires 4 electrically connected to each of the piezoelectric elements are led out from the lower surface of each of the piezoelectric elements 1*a*, 1*b* and 1*c* (FIG. 1 shows the state in which the piezoelectric plate 6 is divided up into each of the piezoelectric elements 1*a*, 1*b* and 1*c*, but does not show the fixing base 2 being divided up).

According to such a construction, due to the thickness of the unit fixing plate 8 and the depth of the formed grooves 9*a*, the parallel direction (widthwise direction (Y)) array accuracy of the comb shaped lead wire 4A can be enhanced. Moreover, due to the grooves 9*a* formed in the unit fixing plate 8, the array accuracy (comb shaped lead wires 4A) in the one-dimensional direction (lengthwise direction (X)) can be enhanced. Furthermore, since the unit fixing plate 8 is formed from ceramic, heat resistance can be enhanced. Moreover, since the damper material is filled into the opening portion 7 formed in the fixing base 2, the vibration damping function can be sufficiently demonstrated.

Second Embodiment

Figure 5:
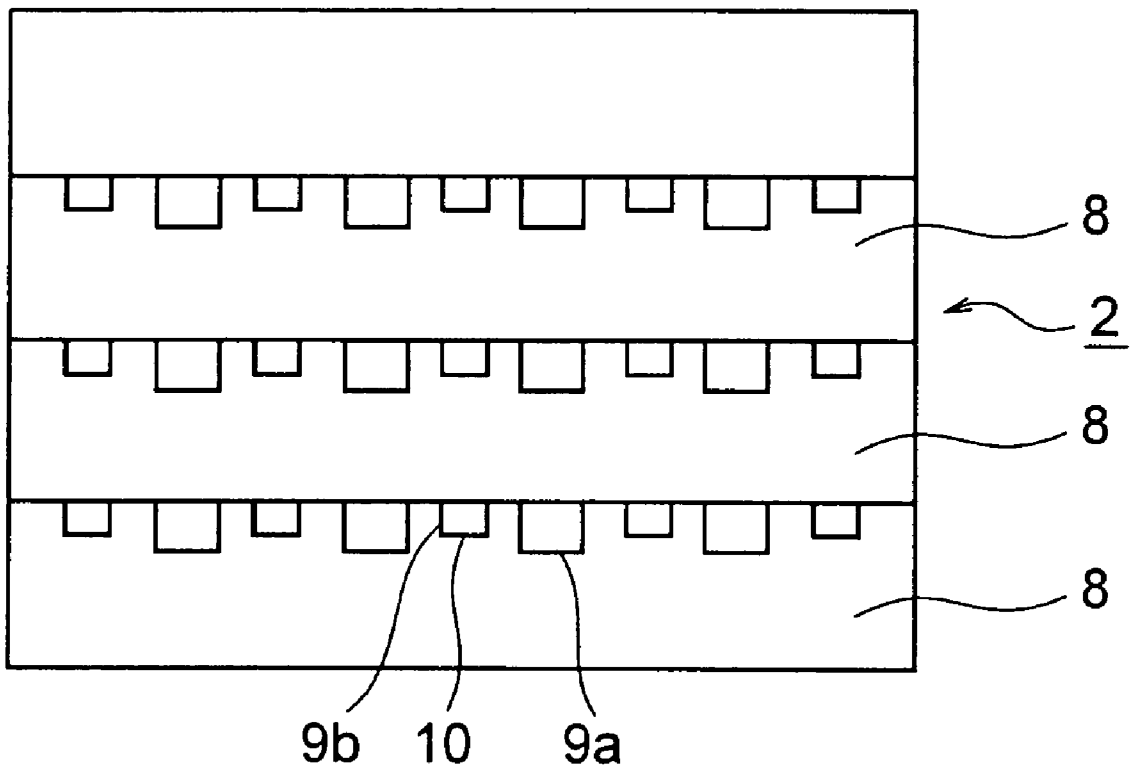
FIG. 5 is a plan view of a fixing plate used in a second embodiment of the ultrasonic probe of the present invention.
Figure 6:
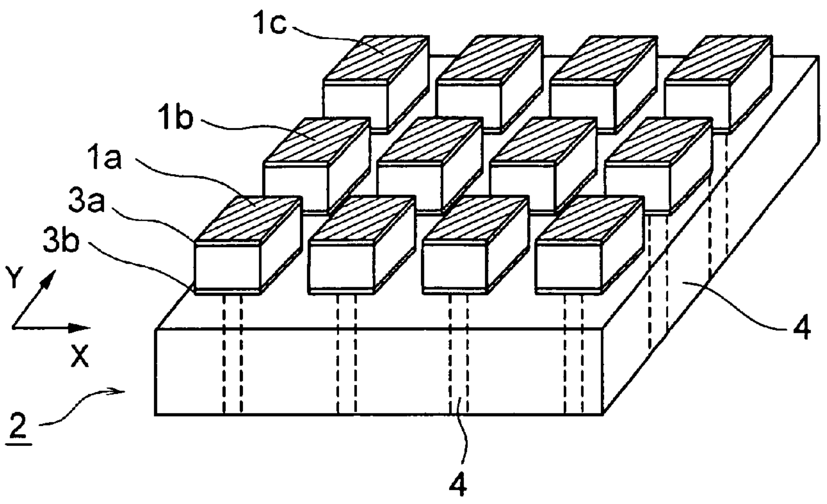
FIG. 6 is a perspective view of a conventional ultrasonic probe.
Figure 7:
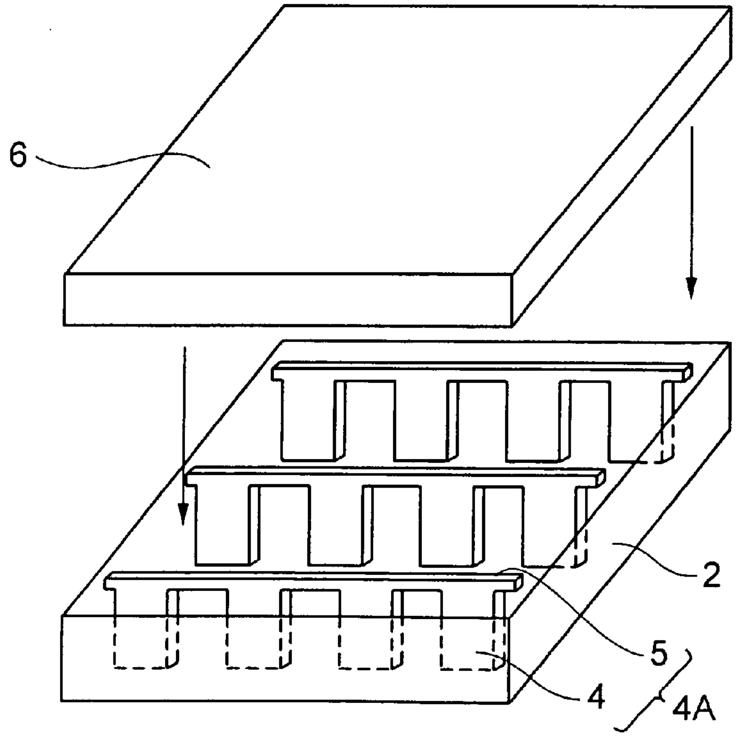
FIG. 7 is an assembly diagram showing a manufacturing method for a conventional ultrasonic probe.

FIG. 5 is a plan view of a fixing base of an ultrasonic probe for explaining a second embodiment of the ultrasonic probe of the present invention, and the manufacturing method therefor.

In this second embodiment, as shown in FIG. 5, the fixing base 2 that fixes the piezoelectric elements 1 arrayed in the two-dimensional direction, is laminated by joining together a plurality of unit fixing plates 8 made of ceramic. That is to say, between the grooves 9*a* in each of the unit fixing plates 8, other grooves 9*b* with shallower groove depths are provided. Then granulated glass (frit glass) is embedded in the grooves 9*b*, and is melted to fill the grooves. Next, the unit fixing plates 8 are superposed with their principal surface directions the same, and are fired. As a result, the glass 10 filled inside the grooves 9*b* is re-melted, and the plurality of unit fixing plates 8 are joined together to give a laminated body (fixing base 2).

Then, as with the first embodiment the comb shaped integrated lead wire 4A is inserted into the grooves 9*a* as shown in FIG. 4, and both principal surfaces of the fixing base 2 are partially cut away to expose the lead wires 4. Moreover, the piezoelectric plate is fixed on one principal surface of the fixing base 2, and the areas between the lead wires 4 are cut and divided up in a similar way to that described above, and individual piezoelectric elements arrayed in a two-dimensional direction are obtained. Also in such a construction, similarly to the first embodiment, the array accuracy of the lead wires in a two-dimensional direction (lengthwise and widthwise directions), and the heat resistance when connecting to a connector can be enhanced.

In the above embodiments, each of the unit fixing plates 8 is joined together by direct union or glass fusion. However, the unit fixing plates 8 may also be joined to each other using a high melting point adhesive for example. Furthermore, the comb shaped integrated lead wire 4A is inserted into the grooves 9*a* after the joining together of the unit fixing plates 8 to form the fixing base 2. However, the unit fixing plates 8 may be joined to each other to form the fixing base 2, in a state in which the comb shaped integrated lead wires 4A are inserted into each of the grooves 9*a* of the unit fixing plates 8.

Also, the lead wires are in the form of the comb shaped integrated lead wire 4A. However these may be individual lead wires. Moreover, the opening portion 7 is formed beforehand in the unit fixing plate 8. However, the opening portion 7 may be formed in the fixing base 2 which is already formed from the laminated unit fixing plates 8. Furthermore, the grooves 9*a* are formed after the firing of the unit fixing plates 8. However at the time of firing a green sheet (ceramic coating), the grooves 9*a* may be already formed.

What is claimed is:

1. An ultrasonic probe in which a plurality of piezoelectric elements are arrayed in a two-dimensional direction on a fixing base, and lead wires from a lower surface of each of said piezoelectric elements, are inserted into said fixing base and electrically connected and led out, wherein said fixing base has an opening portion in an array direction of said piezoelectric elements, and comprises a plurality of unit fixing plates laminated in said array direction, and grooves into which said lead wires are inserted, are formed on one principal surface of each of said unit fixing plates, and damper material is filled into said opening portion.

2. An ultrasonic probe according to claim 1, wherein said fixing base is made from ceramic.

3. An ultrasonic probe according to claim 1, wherein said opening portion is provided beforehand in said unit fixing plates, in the array direction of said piezoelectric elements.

* * * * *